United States Patent
Mawatari

(10) Patent No.: US 9,318,687 B2
(45) Date of Patent: Apr. 19, 2016

(54) PIEZOELECTRIC ELEMENT, PIEZOELECTRIC DEVICE, INK-JET HEAD, AND INK-JET PRINTER

(71) Applicant: KONICA MINOLTA, INC., Tokyo (JP)

(72) Inventor: Kenji Mawatari, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/419,389

(22) PCT Filed: Jul. 25, 2013

(86) PCT No.: PCT/JP2013/070208
§ 371 (c)(1),
(2) Date: Feb. 3, 2015

(87) PCT Pub. No.: WO2014/024696
PCT Pub. Date: Feb. 13, 2014

(65) Prior Publication Data
US 2015/0214465 A1    Jul. 30, 2015

(30) Foreign Application Priority Data

Aug. 10, 2012 (JP) .................................. 2012-178777

(51) Int. Cl.
*B41J 2/045* (2006.01)
*H01L 41/08* (2006.01)
*H01L 41/187* (2006.01)
*H01L 41/319* (2013.01)
*B41J 2/14* (2006.01)
*H01L 41/09* (2006.01)
*H01L 41/316* (2013.01)

(52) U.S. Cl.
CPC ......... *H01L 41/0815* (2013.01); *B41J 2/14201* (2013.01); *B41J 2/14233* (2013.01); *H01L 41/0973* (2013.01); *H01L 41/1876* (2013.01); *H01L 41/319* (2013.01); *B41J 2202/03* (2013.01); *H01L 41/316* (2013.01)

(58) Field of Classification Search
CPC ... B41J 2/14201; B41J 2/14233; H01L 41/18; H01L 41/187
See application file for complete search history.

(56) References Cited

U.S. PATENT DOCUMENTS

| | | | | |
|---|---|---|---|---|
| 6,402,303 | B1* | 6/2002 | Sumi | 347/68 |
| 7,399,067 | B2* | 7/2008 | Kubota et al. | 347/70 |
| 8,262,202 | B2* | 9/2012 | Morozumi | B41J 2/14233 347/68 |
| 2005/0127795 | A1 | 6/2005 | Torii et al. | |
| 2013/0127293 | A1 | 5/2013 | Ikeuchi et al. | |

FOREIGN PATENT DOCUMENTS

| | | |
|---|---|---|
| JP | 06-290983 | 10/1994 |
| JP | 2005-203725 | 7/2005 |
| JP | 2008-042069 | 2/2008 |
| JP | 2012-1119347 | 6/2012 |
| WO | WO 2012/020638 A1 | 7/2011 |

OTHER PUBLICATIONS

International Search Report in International Application No. PCT/JP2013/070208 dated Sep. 10, 2013, 1 page.

* cited by examiner

Primary Examiner — Geoffrey Mruk
(74) Attorney, Agent, or Firm — Brinks Gilson & Lione

(57) ABSTRACT

A piezoelectric element having an electrode, a seed layer for controlling the crystal orientation of a piezoelectric layer, and the piezoelectric layer stacked in this order from the substrate side. The seed layer is composed of two or more layers stacked together each comprising crystals of spherical particles.

17 Claims, 15 Drawing Sheets

RESULTS OF XRD MEASUREMENT ON PLT (PRACTICAL EXAMPLE 1)

RESULTS OF XRD MEASUREMENT ON PZT (PRACTICAL EXAMPLE 1)

(100)
ORIENTATION (111)
ORIENTATION

PIEZOELECTRIC ELEMENT, PIEZOELECTRIC DEVICE, INK-JET HEAD, AND INK-JET PRINTER

This application is a National Stage application of International Application No. PCT/JP2013/070208, filed Jul. 25, 2013.

TECHNICAL FIELD

The present invention relates to a piezoelectric element having an electrode, a seed layer, and a piezoelectric layer stacked in this order on a substrate, a piezoelectric device incorporating such a piezoelectric element, an ink jethead incorporating such a piezoelectric device, and an ink-jet printer.

BACKGROUND ART

Today, piezoelectric substances such as $Pb(Zr,Ti)O_3$ are used in mechanoelectric conversion elements for application in actuators and sensors. Such piezoelectric substances are formed into a thin film on a substrate of Si (silicon) or the like for expected application in MEMS (microelectromechanical system) elements.

MEMS elements can be manufactured by high-precision processing exploiting semiconductor processes such as photolithography, and thus can be made compact, at high density. In particular, forming a large number of MEMS elements simultaneously at high density on a comparatively large Si wafer with a diameter of 6 inches or 8 inches helps greatly reduce costs, compared with forming them individually.

Moreover, forming piezoelectric substances into thin films and forming devices into MEMSs help improve mechanoelectric conversion efficiency, and thereby brings additional benefits such as improved device sensitivity and other characteristics. For example, in heat sensors, forming them into MEMSs reduces their heat conductance, leading to higher measurement sensitivity; in ink-jet heads for printers, forming them into MEMSs increases nozzle density, allowing high-precision patterning.

One common material for a thin film of a piezoelectric substance (piezoelectric thin film) is the crystal composed of Pb, Zr, Ti, and O called PZT (lead zirconate titanate). PZT exhibits a good piezoelectric effect when it has a perovskite structure of the $ABO_3$ type as shown in FIG. 18, and thus has to be made single-phase. The shape of the unit lattice of a PZT crystal having a perovskite structure changes with the ratio of Ti to Zr, which are the elements that can occupy site B. Specifically, a high proportion of Ti gives PZT a cubic crystal lattice, and a high proportion of Zr gives PZT a rhombohedral crystal lattice. With the mol ratio of Zr to Ti near 52:48, the two crystal structures coexist, and the phase boundary with such a composition ratio is called morphotropic phase boundary. An MPB composition provides optimal piezoelectric properties in terms of piezoelectric constant, value of polarization, dielectric constant, etc., and thus piezoelectric thin films of MPB compositions are preferentially used.

What is called piezoelectric effect here is the effect by which a piezoelectric substance deforms when a voltage is applied to it and by which a piezoelectric substance produces an electric field (potential difference) when deformed. FIG. 19 schematically shows how a piezoelectric substance exhibits the piezoelectric effect differently with different crystal orientations. When the piezoelectric substance is in (100) orientation, that is, when the direction P of polarization of the piezoelectric substance is taken as (100) direction and this direction is perpendicular to the substrate, applying an electric field in a direction perpendicular to the substrate permits, since the direction P of polarization of the piezoelectric substance is identical with the direction E of application of the electric field, the intensity of the electric field to be fully converted into the force deforming the piezoelectric substance, allowing efficient deformation of the piezoelectric substance in the direction perpendicular to the substrate. By contrast, when the piezoelectric substance is in (111) orientation, since the direction P of polarization of the piezoelectric substance, i.e., (100) direction, crosses the direction E of application of the electric field, the intensity of the electric field is not fully converted into the force deforming the piezoelectric substance, resulting in smaller deformation of the piezoelectric substance in the direction perpendicular to the substrate.

As discussed above, the piezoelectric properties of a piezoelectric substance change also with its crystal orientation, (100) orientation yielding better piezoelectric properties than (111) orientation. When a piezoelectric thin film is used as a MEMS actuator, it needs to be formed with a thickness of 3 μm to 5 μm to meet the required displacement producing force, and its driving requires good piezoelectric properties. This makes (100) orientation preferable as the crystal orientation of a piezoelectric thin film.

In some cases, however, (111) orientation or other crystal orientation can be preferable in terms of fatigue properties and ease of processing. Specifically, forming a piezoelectric thin film in (111) orientation is preferable to forming one in (100) orientation in that domain rotation is less likely during voltage application, making patterning by etching easier. In either case, controlling the crystal orientation of a piezoelectric thin film is essential to obtain stable properties.

A piezoelectric thin film can be formed on a substrate of Si or the like by chemical film formation, such as CVD (chemical vapor deposition), or by physical film formation, such as sputtering or ion plating, or by liquid-phase growth, such as sol-gel process.

An attempt to form a thin film of piezoelectric substance (with a thickness of several micrometers) on a Si substrate or the like often ends in a failure to obtain the desired properties. This can be attributed to residual stress due to a difference in lattice constant, or in coefficient of linear expansion, between the substrate or a lower electrode and the piezoelectric thin film, hampering formation of the perovskite structure and crystal orientation needed in the piezoelectric thin film.

As a remedy, according to a known technology, a primer layer (buffer layer, seed layer) is provided between a substrate and a piezoelectric layer to control the crystallinity of the piezoelectric layer. For example, according to Patent Document 1 identified below, a primer layer of PLT (lead lanthanate titanate) is provided between a substrate and a piezoelectric layer (e.g., PLZT, i.e., lead lanthanum zirconium titanate). PLT in the primer layer has a property of easily forming a perovskite crystal even on a Si substrate or a lower electrode. Thus, forming a piezoelectric layer on such a primer layer facilitates formation of the piezoelectric layer with a perovskite structure.

For another example, according to Patent Document 2 identified below, a piezoelectric layer (PZT) is composed of two layers, namely a first piezoelectric film and a second piezoelectric film, and a buffer layer of PLT is provided between a substrate and the piezoelectric layer. The PLT comprises columnar particles with a cross-sectional diameter of, e.g., 40 nm. In the piezoelectric layer, the cross-sectional diameter (e.g., 160 nm) of columnar particles forming the second piezoelectric film is larger than the cross-sectional diameter (e.g., 40 m) of columnar particles forming the first piezoelectric film, which is the closer to the buffer layer. With this structure, while adhesion of the piezoelectric layer is improved to prevent exfoliation, good piezoelectric properties are obtained.

LIST OF CITATIONS

Patent Literature

Patent Document 1: JP-A-H6-290983 (see claim 1; paragraphs [0008], [0014]; FIG. 1)
Patent Document 2: JP-A-2005-203725 (see claim 2; paragraphs [0017], [0019], [0139]-[0143]; etc.)

SUMMARY OF THE INVENTION

Technical Problem

Nowadays, piezoelectric elements with increasingly large displacements are sought, and accordingly improved withstand voltages are required in them. Withstand voltage denotes the limit of voltage that can be applied to a piezoelectric element. Applying a voltage over the withstand voltage causes dielectric breakdown inside the piezoelectric thin film, and destroys the element. Thus, an improved withstand voltage is essential to allow application of a higher voltage to the piezoelectric thin film to obtain a larger displacement; a reduced withstand voltage greatly diminishes the reliability of the element.

Inconveniently, the structure of a conventional piezoelectric element where a seed layer is provided between a substrate and a piezoelectric layer does not allow a satisfactory improvement in withstand voltage. This will now be elaborated on with reference to drawings.

FIG. 20 is a sectional view schematically showing an outline of the structure of a conventionally common piezoelectric element 100 that includes a seed layer. The piezoelectric element 100 is composed of a lower electrode 102, a seed layer 103, a piezoelectric layer 104, and an upper electrode (unillustrated) stacked in the order named on top of a substrate 101. When the seed layer 103 and the piezoelectric layer 104 are formed by sputtering, their crystals typically grow in a columnar shape and form columnar crystals (columnar particles). This is discussed in Patent Document 2 mentioned above, and can be understood more clearly from FIG. 21.

FIG. 21 schematically shows a typical growth process of crystals 201 as observed when the seed layer 103 of the piezoelectric element 100 is formed by sputtering. First, on the primer layer (lower electrode 102), crystal nuclei 201a of the material of the seed layer 103 are formed, and starting with those crystal nuclei 201a, crystals 201 grow. As the growth proceeds, neighboring crystals 201 meet and thereafter grow in the film thickness direction, in a columnar shape.

In FIG. 20, with the seed layer 103 comprising columnar crystals, the interfaces between neighboring columnar crystals, i.e., grain boundaries 103a, extend straight in the film thickness direction of the seed layer 103. Thus, when a voltage is applied between the upper and lower electrodes across the piezoelectric layer 104, the grain boundaries 103a provide leak paths for current. This is considered to cause dielectric breakdown.

In an example presented in Patent Document 2, the piezoelectric element is inspected for exfoliation etc. while a triangular-wave voltage varying from 0 V to −100 V (with a frequency of 2 kHz) is applied to the electrodes. However, with application of a triangular-wave voltage, the maximum voltage (in the example under discussion, 100 V in absolute value terms) is applied to the electrodes only momentarily (in the example under discussion, ½₀₀₀ seconds). In piezoelectric devices such as ink-jet heads, which assume application of a DC (direct-current) voltage, a DC voltage is applied continuously for a predetermined period according to the print position. Thus, from the perspective of application in such devices, tolerating application of a triangular-wave voltage varying from 0 V to −100 V does not guarantee a sufficient withstand voltage.

Devised against the background discussed above, the present invention aims to provide a piezoelectric element that despite having a seed layer between a substrate and a piezoelectric layer offers a satisfactorily improved withstand voltage in actual use, a piezoelectric device incorporating such a piezoelectric element, an ink jethead incorporating such a piezoelectric device, and an ink-jet printer.

Means for Solving the Problem

According to one aspect of the present invention, a piezoelectric element has an electrode, a seed layer for controlling crystal orientation of a piezoelectric layer, and the piezoelectric layer stacked in this order from the substrate side. Here, the seed layer is composed of two or more layers stacked together each comprising crystals of spherical particles.

DESCRIPTION OF EMBODIMENTS

Embodiments of the present invention will be described below with reference to the accompanying drawings.

[Structure of Piezoelectric Element]

Figure 1:
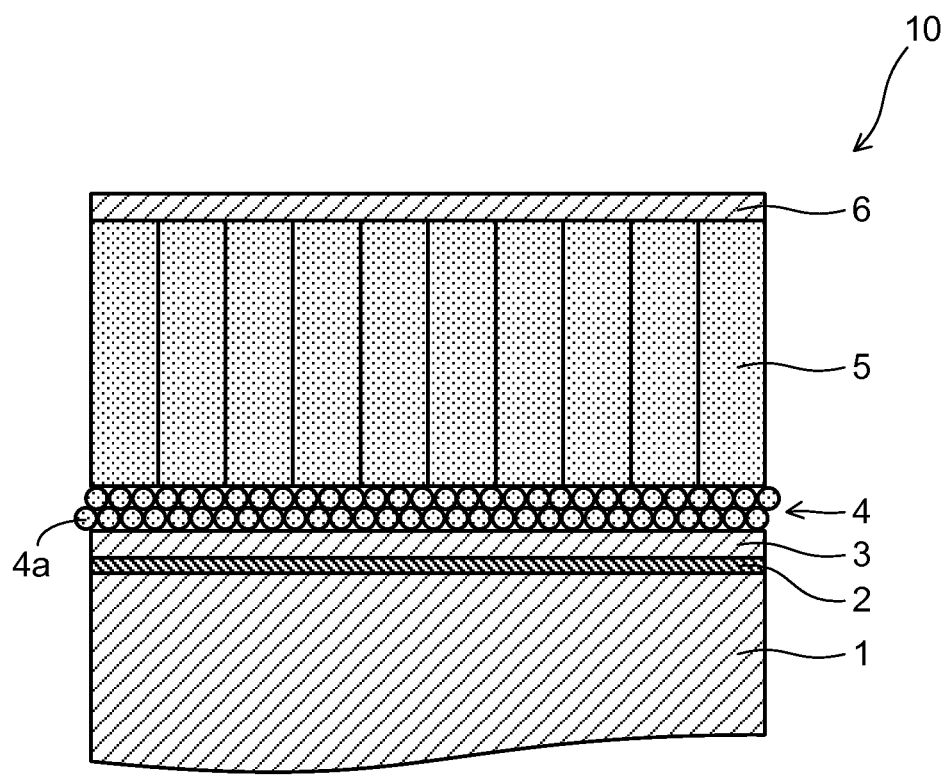
FIG. 1 is a sectional view schematically showing an outline of the structure of a piezoelectric element according to one embodiment of the present invention.

FIG. 1 is a sectional view schematically showing an outline of the structure of a piezoelectric element 10 according to one embodiment of the present invention. The piezoelectric element 10 has a thermally oxidized film 2, a lower electrode 3, a seed layer 4, a piezoelectric layer 5, and an upper electrode 6 stacked in the order named on top of a substrate 1. The part of the piezoelectric element 10 excluding the upper electrode 6, i.e., the part composed of the layers up to the piezoelectric layer 5 stacked on top of the substrate 1, constitutes a piezoelectric thin-film substrate.

The substrate 1 is a semiconductor substrate or an SOI (silicon on insulator) substrate of monocrystalline Si (silicon) with a thickness of, e.g., about 300 μm to about 500 μm. The thermally oxidized film 2 is a layer of SiO₂ (silicon oxide) with a thickness of, e.g., about 0.1 μm, and is formed to protect and electrically insulate the substrate 1.

The lower electrode 3 is composed of a Ti (titanium) layer and a Pt (platinum) layer stacked together. The Ti layer is formed to improve adhesion between the thermally oxidized film 2 and the Pt layer. The Ti layer has a thickness of, e.g., about 0.02 μm, and the Pt layer has a thickness of, e.g., about 0.1 μm.

The seed layer 4 serves to control the crystallinity of the piezoelectric layer 5, and is also called buffer layer. The seed layer 4 is, e.g., a layer of PLT (lead lanthanate titanate), and will be described in detail later.

The piezoelectric layer 5 is a layer of PZT (lead zirconate titanate), which is a solid solution of PTO (PbTiO₃, lead titanate) and PZO (PbZrO₃, lead zirconate). The thickness of PZT varies depending on the use, and is typically, for use in memories and sensors, e.g., 1 μm or less and, for use in actuators, e.g., 3 μm to 5 μm. In the embodiment, the Ti/Zr ratio in the piezoelectric layer 5 is set to be equal to or close to the ratio (48/52 to 47/53) forming the morphotropic phase boundary (MPB) mentioned earlier.

The upper electrode 6 is located on the opposite side of the piezoelectric layer 5 from the lower electrode 3, and is composed of a Ti layer and a Pt layer stacked together. The Ti layer is formed to improve adhesion between the piezoelectric layer 5 and the Pt layer. The Ti layer has a thickness of, e.g., about 0.02 μm, and the Pt layer has a thickness of, e.g., about 0.1 μm to about 0.2 μm.

The lower electrode 3, the seed layer 4, the piezoelectric layer 5, and the upper electrode 6 are formed by sputtering.

[Seed Layer]

Next, the seed layer 4 mentioned above will be described in detail. As shown in FIG. 1, the seed layer 4 is composed of two or more layers stacked together, each layer comprising crystals 4a of spherical particles. In the present description, "spherical" in "spherical particles" denotes a shape that is not "columnar," i.e., that is not a shape extending in one direction while keeping the same cross-sectional shape; thus the term "spherical" covers not only a perfectly spherical shape but also any modified spherical shape, a shape with an elliptical cross section, a polyhedral shape other than columnar, any shape defined by a combination of flat and curved surfaces, a shape with bumps and dents, etc. While the following description assumes this interpretation of the term "spherical," the drawings show spherical particles with a perfectly spherical shape for convenience' sake.

The spherical particles have a particle diameter (cross-sectional diameter) of, e.g., about 10 nm to about 50 nm, which is ten times or more as large as the lattice constant (about 0.4 nm) of PLT. That is, a number of unit crystals of PLT gather together to form a single spherical particle (crystal 4a).

As mentioned earlier, when a seed layer is formed by sputtering, it typically grows to form columnar crystals. However, by ingeniously controlling film forming conditions such as substrate temperature and sputtering pressure, crystals 4a of spherical particles as mentioned above can be grown to form the seed layer 4. An elaboration follows.

Figure 2:
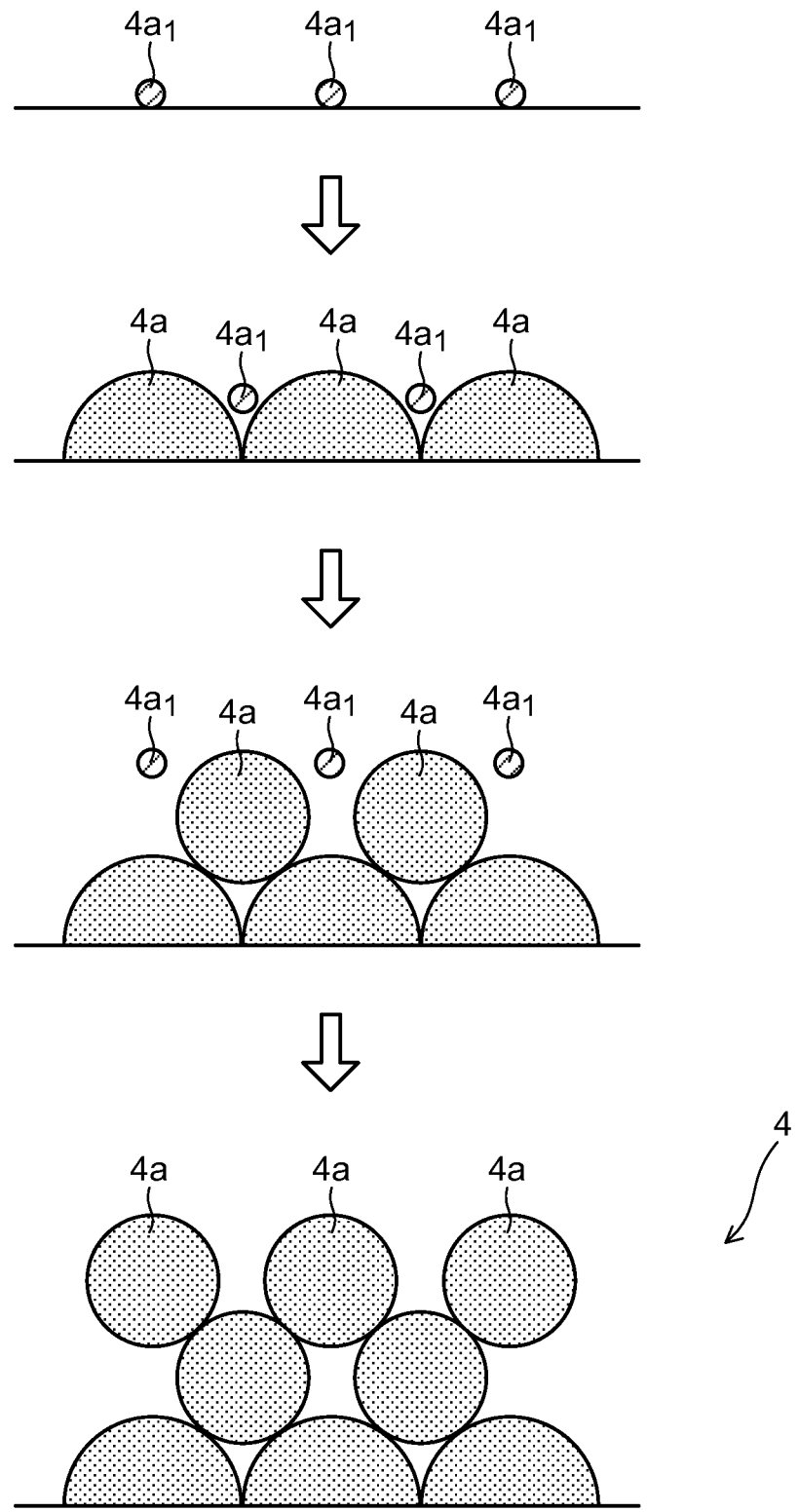
FIG. 2 is a sectional view schematically showing the growth process of crystals as observed when a seed layer in the above piezoelectric element is formed by sputtering.

FIG. 2 schematically shows how crystals 4a grow when the seed layer 4 is formed by sputtering. In the embodiment, the film forming conditions under which the seed layer 4 is formed by sputtering are so set as to increase the kinetic energy of particles (a component of the material of the target) struck off the target, in order to facilitate formation of crystal nuclei $4a_1$. Then, as crystals 4a grow starting with the crystal nuclei $4a_1$, new crystal nuclei $4a_1$ form almost simultaneously. Thus, before crystals 4a in a lower layer grow columnar (after spherical particles have formed), crystals 4a in an upper layer can be grown starting with crystal nuclei $4a_1$ that have lodged in the gaps between the crystals 4a in the lower layer. Thereafter, by the same mechanism, one layer of crystals 4a of spherical particles after another can be stacked. Here, crystal nuclei $4a_1$ in an upper layer are smaller particles than crystals 4a and tend to lodge in the gaps between crystals 4a in a lower layer; thus, no spherical particles to constitute crystals 4a in an upper layer form right above spherical particles constituting crystals 4a in a lower layer. That is, between an upper and a lower layer of the seed layer 4, spherical particles are located shifted in the direction perpendicular to the film thickness direction of the seed layer 4. In FIG. 2, the seed layer 4 has three layers, including the lowest layer with crystals illustrated in a hemispherical shape. As will be understood from this diagram, spherical particles can have a modified shape with different dimensions in the film thickness direction and the substrate plane direction.

Forming the seed layer 4 out of two or more layers each comprising crystals 4a of spherical particles as described above helps locate spherical particles shifted between an upper and a lower layer of the seed layer 4, and thus helps connect together into a web the interfaces between neighboring spherical particles (grain boundaries). This helps avoid formation of such grain boundaries as extend straight in the film thickness direction of the seed layer 4, i.e., helps avoid formation of current leak paths. As a result, even with a structure including a seed layer 4, withstand voltage in actual use, i.e., under constant application of a predetermined DC in application to a device such as an ink jethead, can be improved satisfactorily, and thus the reliability of the piezoelectric element can be improved. Specific values of withstand voltage will be given in the description of practical examples presented below.

In particular, owing to spherical particles in an upper layer of the seed layer 4 being shifted in the direction perpendicular to the film thickness direction from right above spherical particles in the layer immediately beneath, grain boundaries are reliably connected together into a web, reliably preventing formation of leak paths extending straight in the film thickness direction of the seed layer 4. This helps reliably improve withstand voltage in actual use.

The improved withstand voltage of the piezoelectric element 10 permits a high voltage to be applied between the upper and lower electrodes 6 and 3 to produce a large displacement in the piezoelectric layer 5, and thus helps obtain a piezoelectric element 10 with good piezoelectric properties.

As examples embodying the present invention, Practical Examples 1 to 3 will be presented below, along with a comparative example for comparison with Practical Examples 1 to 3.

PRACTICAL EXAMPLE 1

Figure 3A:
FIG. 3A is a sectional view showing a manufacturing step of a piezoelectric element according to Practical Example 1.

FIGS. 3A to 3D are sectional views showing manufacturing steps of a piezoelectric element 10 according to Practical Example 1. First, as shown in FIG. 3A, on a substrate 1, which is a monocrystalline Si wafer with a thickness of about 400 μm, a thermally oxidized film 2 of, e.g., $SiO_2$ with a thickness of about 100 nm was formed. The substrate 1 can be a common one with, e.g., a thickness of 300 μm to 725 μm and a diameter of 3 inches to 8 inches. The thermally oxidized film 2 can be formed by exposing the substrate 1 to high temperature of about 1200° C. in an atmosphere of oxygen in a wet oxidation furnace.

Figure 3B:
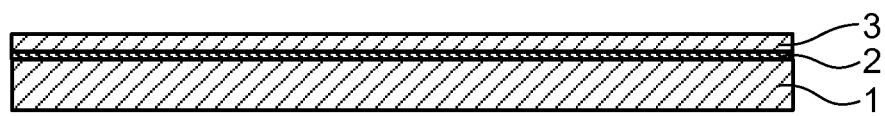
FIG. 3B is a sectional view showing a manufacturing step of a piezoelectric element according to Practical Example 1.

Next, as shown in FIG. 3B, on the thermally oxidized film 2, a Ti layer (adhesion layer) with a thickness of about 10 nm and a Pt layer with a thickness of about 100 nm were formed in this order by sputtering to form a lower electrode 3. Here, Ti was sputtered at an Ar flow rate of 20 sccm, a pressure of 0.9 Pa, a target-applied RF power of 100 W, and a substrate temperature of 400° C.; Pt was sputtered at an Ar flow rate of 20 sccm, a pressure of 0.8 Pa, a target-applied RF power of 150 W, and a substrate temperature of 400° C.

Figure 3C:
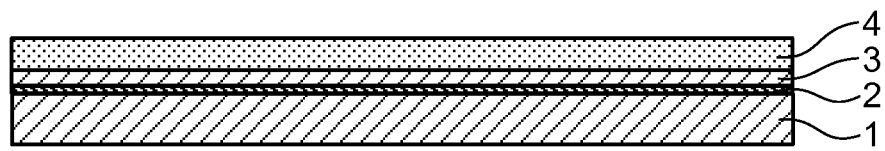
FIG. 3C is a sectional view showing a manufacturing step of a piezoelectric element according to Practical Example 1.

Next, as shown in FIG. 3C, on the Pt layer of the lower electrode 3, a PLT layer with a thickness of about 100 nm was formed by sputtering to form a seed layer 4. Here, PLT was sputtered at an Ar flow rate of 30 sccm, an $O_2$ flow rate of 0.6 sccm, a pressure of 0.5 Pa, a target-applied RF power of 150 W, and a substrate temperature of 600° C.

In this practical example, the Ti, Pt, and PLT layers were formed on a three-target (tertiary) sputtering machine that had three targets, namely Ti, Pt, and PLT, inside a chamber. This allowed the stacked structure of PLT/Pt/Ti/Si substrate to be formed continuously in situ, without breaking vacuum (see FIGS. 3B and 3C).

Figure 4:
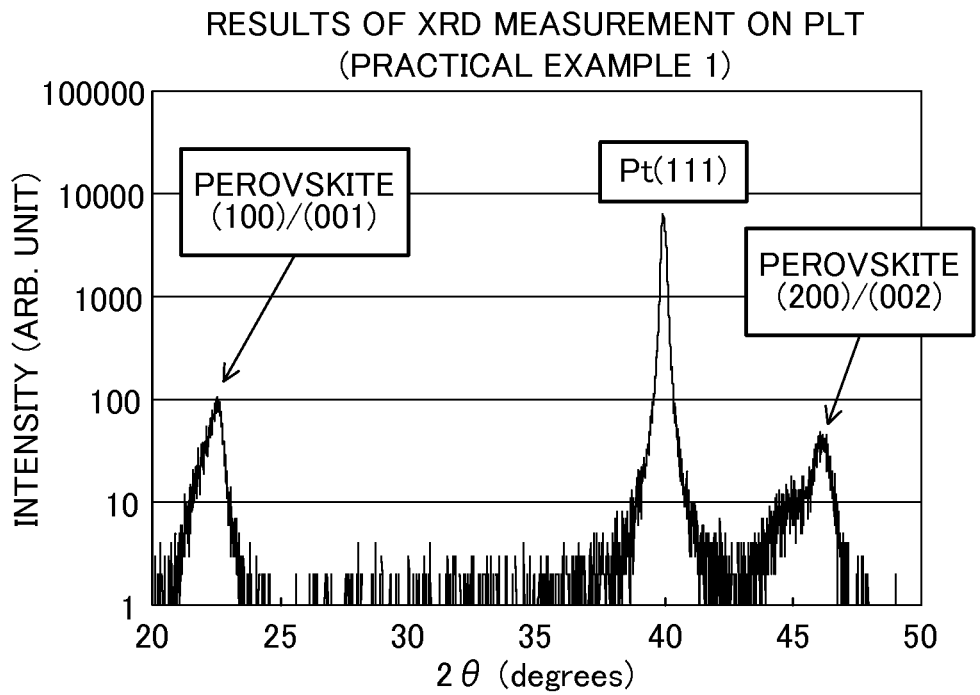
FIG. 4 is a plot of results of 2θ/θ measurement by XRD with respect to PLT forming a seed layer in a piezoelectric element according to Practical Example 1.

Forming the Ti, Pt, and PLT layers with the thicknesses and under the film forming conditions mentioned above yielded PLT crystals of spherical particles. FIG. 4 shows the results of 2θ/θ measurement by XRD (X-ray diffraction) with respect to the PLT in the seed layer 4 in Practical Example 1. In FIG. 4, the vertical axis represents intensity (diffraction intensity, reflection intensity) as expressed in arbitrary unit corresponding to counts per second (cps) of X rays. How intensity is represented along the vertical axis here is common to all similar plots showing XRD measurement results.

FIG. 4 reveals that the seed layer 4 of PLT was strongly aligned with (100) or (001) plane of perovskite (meaning, the perovskite structure). PLT has a substantially cubic (quasi-cubic) crystal structure, and its (100) and (001) planes are substantially equivalent; accordingly, in the following description, the two planes are collectively referred to as (100) plane unless otherwise stated.

Here, let the peak intensities in different plane directions of perovskite as observed by X-ray diffraction be represented by (100), (110), and (111) respectively, and let the degree of alignment of (100) plane be expressed by $(100)/[(100)+(110)+(111)] \times 100$. Then, calculating the degree of alignment of (100) plane of PLT according to this formula using the peak intensities shown in FIG. 4 gives a degree of alignment of 99%. This means that, in PLT, 90% or more of crystals were aligned with (100) or (001) plane of perovskite.

On the other hand, observation on a SEM (scanning electron microscope) revealed that PLT crystals had a particle diameter of about 40 nm, and that the seed layer 4 of PLT had a structure in which two layers each comprising crystals 4a of spherical particles were stacked together.

Figure 3D:
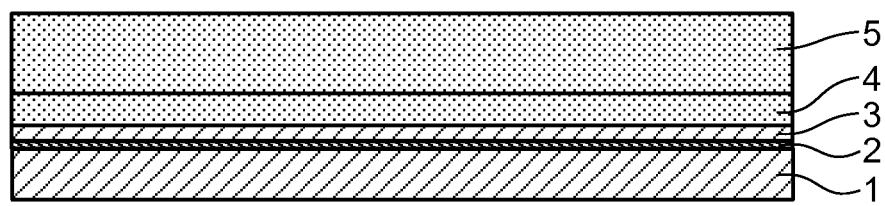
FIG. 3D is a sectional view showing a manufacturing step of a piezoelectric element according to Practical Example 1.

Next, as shown in FIG. 3D, on a sputtering machine, further on the seed layer 4 of PLT, PZT was formed with a thickness of about 4 μm to form a piezoelectric layer 5. Here, PZT was sputtered at an Ar flow rate of 30 sccm, an $O_2$ flow rate of 0.6 sccm, a pressure of 0.5 Pa, a substrate temperature of 600° C., and a target-applied RF power of 500 W. The piezoelectric layer 5 can be formed otherwise than by sputtering: it can instead be formed by physical film formation, such as pulse-laser deposition (PLD) or ion plating, or by chemical film formation, such as MOCVD (metal organic chemical vapor deposition) or sol-gel process.

The sputtering target had a mol ratio of Zr to Ti (Zr/Ti ratio) of 52/48. Pb contained in the target tends to re-vaporize during high-temperature film formation, and tends to cause a Pb deficiency in the thin film formed. Therefore, preferably, somewhat more Pb is added in the target than the stoichiometric ratio dictates. For example, preferably, 10% to 30% more Pb than the stoichiometric ratio dictates is added, depending on film formation temperature.

Figure 5:
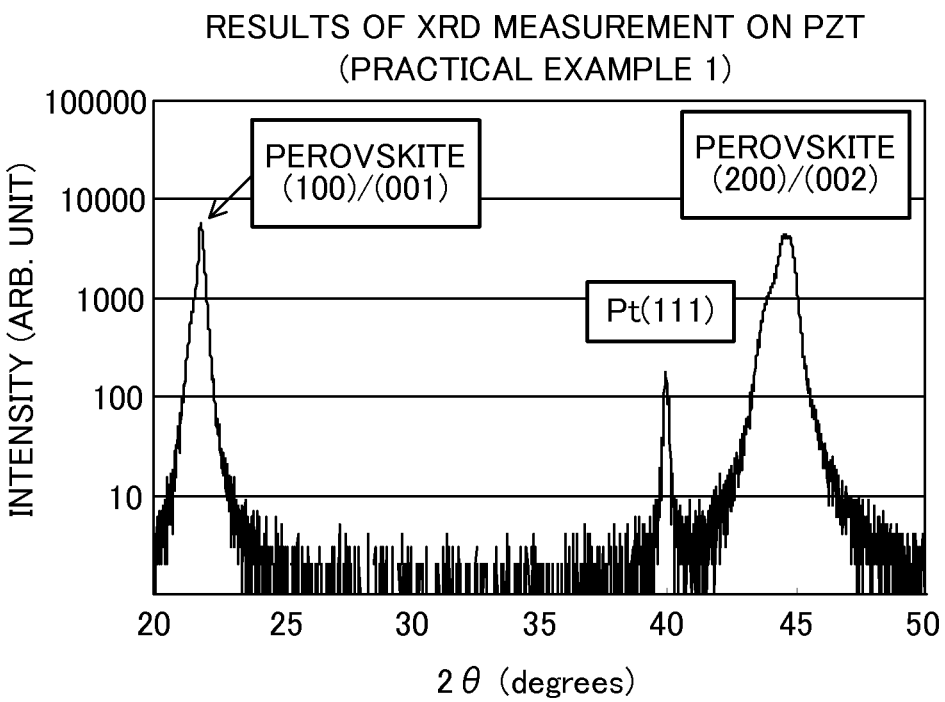
FIG. 5 is a plot of results of 2θ/θ measurement by XRD with respect to PZT forming a piezoelectric layer in a piezoelectric element according to Practical Example 1.

FIG. 5 shows the results of 2θ/θ measurement by XRD with respect to the PZT in the piezoelectric layer 5 in Practical Example 1. Calculating the degree of alignment of (100) plane of PZT by the same method (according to the same formula) as for PLT using the peak intensities shown in FIG. 5 gave a degree of alignment of 99%. PZT has a cubic crystal structure when the Zr/Ti ratio is exactly equal to the ratio forming the MPB, in which case (100) and (001) planes can be considered equivalent. Thus, the calculated degree of alignment can be said to indicate that 90% or more of crystals were aligned with (100) or (001) plane of perovskite.

Figure 6:
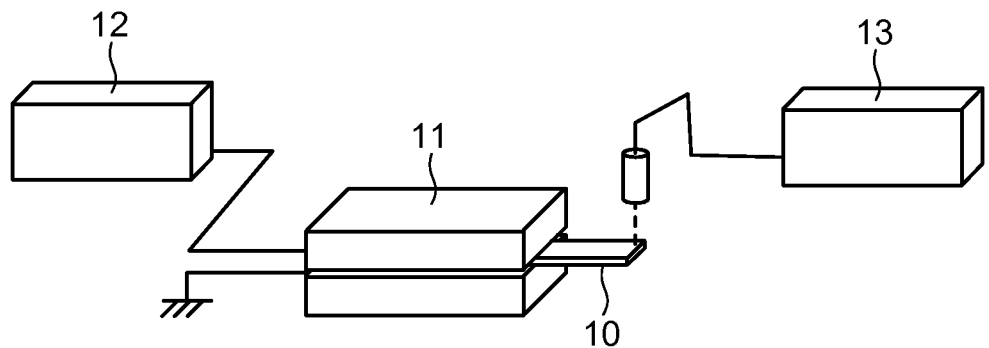
FIG. 6 is a perspective view showing an outline of the configuration of a piezoelectric displacement tester.

Next, on the piezoelectric layer 5, e.g., Ti and Pt were sputtered in this order to form an upper electrode 6 (see FIG. 1), thereby completing the production of the piezoelectric element 10. The piezoelectric element 10 was separated and taken out from the center of the wafer, and was examined by a cantilever method on a piezoelectric displacement tester as shown in FIG. 6 to measure piezoelectric displacement to determine piezoelectric constant $d_{31}$. The piezoelectric constant $d_{31}$ was −170 pm/V.

On the piezoelectric displacement tester, an end part of the piezoelectric element 10 was clamped in a holder 11 so as to construct a cantilever structure with a movable length of 10 mm. Then, from a function generator 12, a voltage of 0 V at the maximum was applied to the upper electrode 6, and a voltage of −20 V at the minimum was applied to the lower electrode 3, at a frequency of 500 Hz. Meanwhile, the displacement of the free end of the piezoelectric element 10 was observed with a laser Doppler oscillation meter 13. From the measured piezoelectric displacement, the piezoelectric constant $d_{31}$ was determined by a well-known method.

Figure 7:
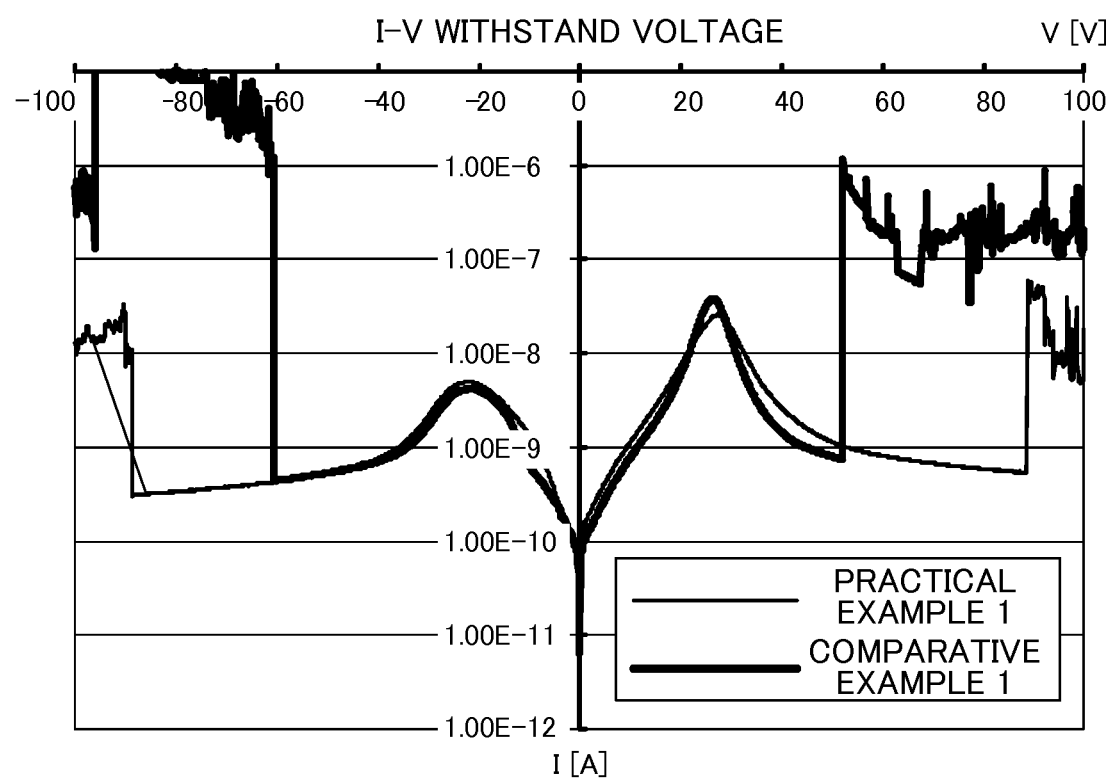
FIG. 7 is a plot of results of withstand voltage measurement with respect to piezoelectric elements according to Practical Example 1 and Comparative Example 1.

Next, with a semiconductor device analyzer, model B1500A manufactured by Agilent Technologies, the withstand voltage of the piezoelectric element 10 was measured through I-V measurement. The withstand voltage was, with a positive bias, +88 V and, with a negative bias, −89 V. A positive bias denotes a state in which, while the lower electrode 3 is kept grounded, a positive voltage is (not periodically but) continuously applied to the upper electrode 6. A negative bias denotes a state in which, while the lower electrode 3 is kept grounded, a negative voltage is (not periodically but) continuously applied to the upper electrode 6. FIG. 7 shows the results of withstand voltage measurement in Practical Example 1.

PRACTICAL EXAMPLE 2

In Practical Example 2, as in Practical Example 1, first, on a substrate 1, a thermally oxidized film 2 was formed, and then, on the thermally oxidized film 2, a Ti layer (adhesion layer) with a thickness of about 6 nm and a Pt layer with a thickness of about 100 nm were formed by sputtering to form a lower electrode 3. Here, Ti was sputtered at an Ar flow rate of 20 sccm, a pressure of 0.7 Pa, a target-applied RF power of 90 W, and a substrate temperature of 400° C.; Pt was sputtered at an Ar flow rate of 20 sccm, a pressure of 0.4 Pa, a target-applied RF power of 150 W, and a substrate temperature of 400° C.

Next, on the Pt layer of the lower electrode 3, a PLT layer with a thickness of 150 nm was formed by sputtering to form a seed layer 4. Here, PLT was sputtered at an Ar flow rate of 30 sccm, an $O_2$ flow rate of 0.5 sccm, a pressure of 0.5 Pa, a target-applied RF power of 150 W, and a substrate temperature of 640° C.

Figure 8:
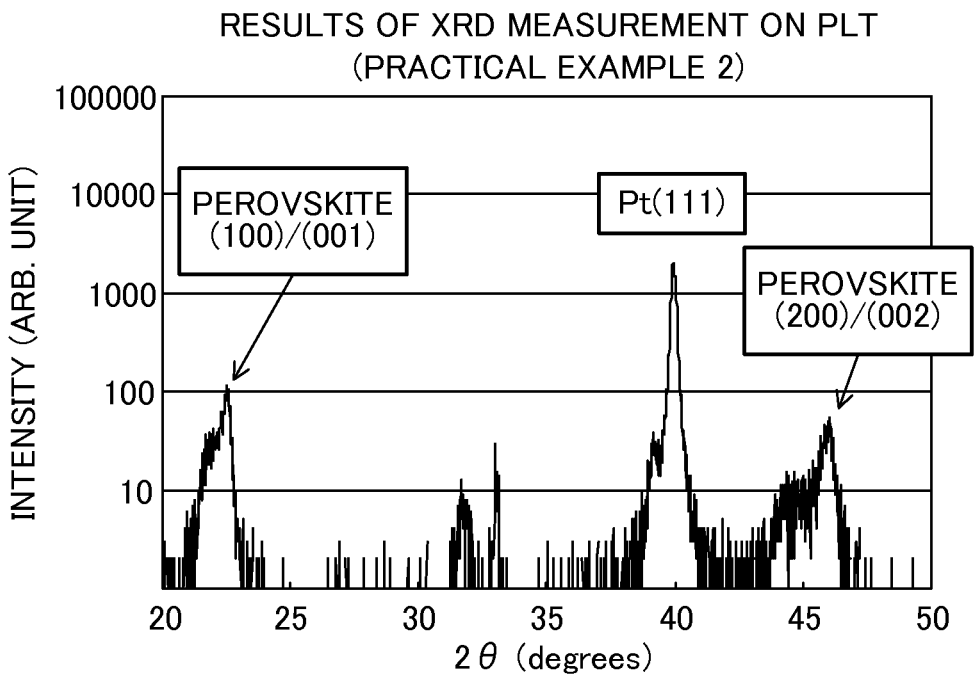
FIG. 8 is a plot of results of 2θ/θ measurement by XRD with respect to PLT forming a seed layer in a piezoelectric element according to Practical Example 2.

Forming the Ti, Pt, and PLT layers with the thicknesses and under the film forming conditions mentioned above yielded PLT crystals of spherical particles. FIG. 8 shows the results of 2θ/θ measurement by XRD with respect to the PLT in the seed layer 4 in Practical Example 2.

FIG. 8 reveals that the seed layer 4 of PLT was strongly aligned with (100) or (001) plane of perovskite. Moreover, calculating the degree of alignment of (100) plane of PLT as in Practical Example 1 using the peak intensities shown in FIG. 8 gave a degree of alignment of 95%. This means that, also in the PLT in Practical Example 2, 90% or more of crystals were aligned with (100) or (001) plane of perovskite.

On the other hand, observation on a SEM revealed that PLT crystals had a particle diameter of about 50 nm, and that the seed layer 4 of PLT had a structure in which three layers each comprising crystals 4a of spherical particles were stacked together.

Next, on a sputtering machine, further on the seed layer 4 of PLT, PZT was formed with a thickness of about 4 µm to form a piezoelectric layer 5. Here, PZT was sputtered at an Ar flow rate of 30 sccm, an $O_2$ flow rate of 0.6 sccm, a pressure of 0.5 Pa, a substrate temperature of 600° C., and a target-applied RF power of 500 W. The sputtering target had a mol ratio of Zr to Ti (Zr/Ti ratio) of 50/50.

Figure 9:
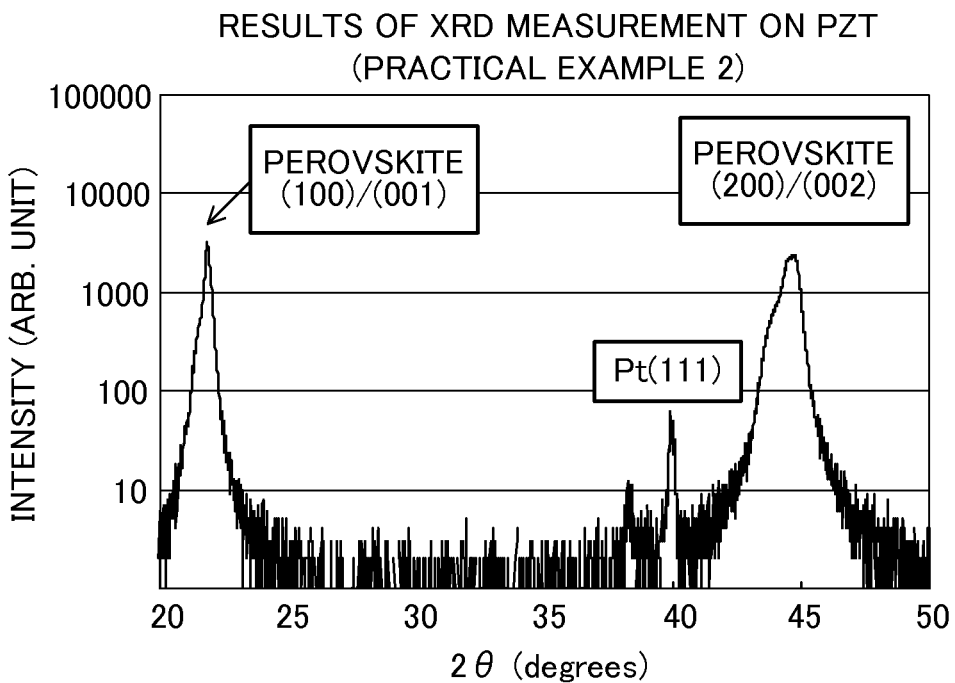
FIG. 9 is a plot of results of 2θ/θ measurement by XRD with respect to PZT forming a piezoelectric layer in a piezoelectric element according to Practical Example 2.

FIG. 9 shows the results of 2θ/θ measurement by XRD with respect to the PZT in the piezoelectric layer 5 in Practical Example 2. Calculating the degree of alignment of (100) plane of PZT by the same method (according to the same formula) as for PLT using the peak intensities shown in FIG. 9 gave a degree of alignment of 99%. Judging from PZT exhibiting no separation between the peaks corresponding to (100) and (001) planes, respectively, of perovskite in FIG. 9, (100) and (001) planes can be considered substantially equivalent (meaning that the crystal structure is close to cubic). Thus, the calculated degree of alignment can be said to indicate that 90% or more of crystals were aligned with (100) or (001) plane of perovskite.

Next, on the piezoelectric layer 5, an upper electrode 6 was formed, thereby completing the production of the piezoelectric element 10. Then, as with Practical Example 1, through examination by a cantilever method on a piezoelectric displacement tester, piezoelectric displacement was measured and piezoelectric constant $d_{31}$ was determined. The piezoelectric constant $d_{31}$ was −150 pm/V. Also, as with Practical Example 1, the withstand voltage of the piezoelectric element 10 was measured. The withstand voltage was, with a positive bias, +96 V and, with a negative bias, −84 V. That is, Practical Example 2 had a piezoelectric constant $d_{31}$ slightly lower than that in Practical Example 1, but had withstand voltages comparable with those in Practical Example 1.

PRACTICAL EXAMPLE 3

In Practical Example 3, first, on a substrate 1, a thermally oxidized film 2 was formed as in Practical Example 1. Then, on the thermally oxidized film 2, a Ti layer (adhesion layer) with a thickness of about 6 nm and a Pt layer with a thickness of about 100 nm were formed by sputtering to form a lower electrode 3. Here, Ti was sputtered at an Ar flow rate of 20 sccm, a pressure of 0.8 Pa, a target-applied RF power of 90 W, and a substrate temperature of 550° C.; Pt was sputtered at an Ar flow rate of 20 sccm, a pressure of 0.4 Pa, a target-applied RF power of 150 W, and a substrate temperature of 550° C.

Next, on the Pt layer of the lower electrode 3, a PLT layer with a thickness of 150 nm was formed by sputtering to form a seed layer 4. Here, PLT was sputtered at an Ar flow rate of 30 sccm, an $O_2$ flow rate of 0.5 sccm, a pressure of 0.5 Pa, a target-applied RF power of 150 W, and a substrate temperature of 690° C.

Figure 10:
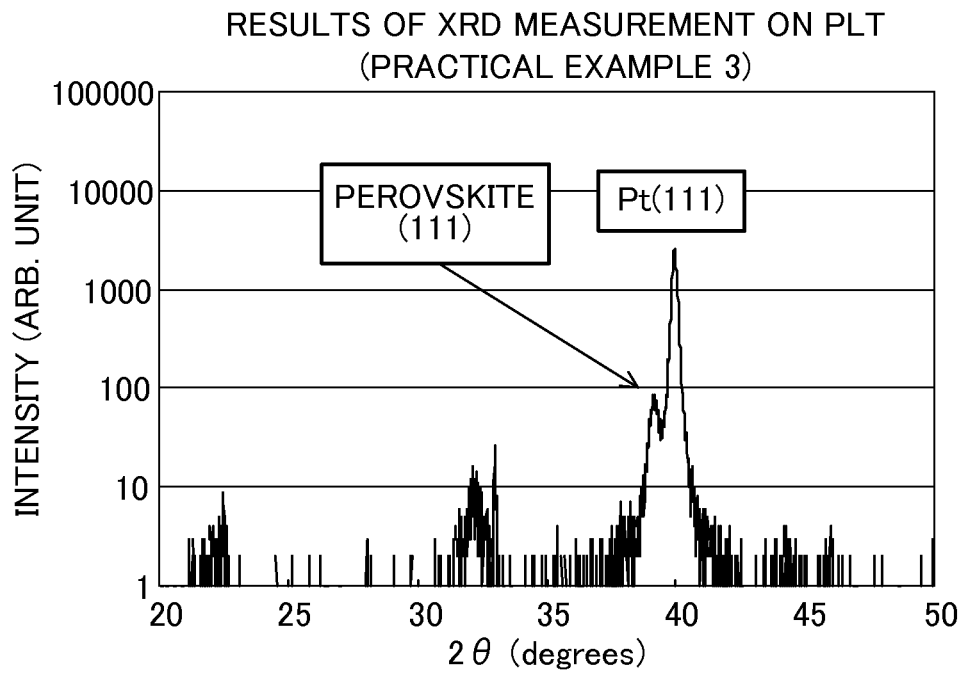
FIG. 10 is a plot of results of 2θ/θ measurement by XRD with respect to PLT forming a seed layer in a piezoelectric element according to Practical Example 3.

Forming the Ti, Pt, and PLT layers with the thicknesses and under the film forming conditions mentioned above yielded PLT crystals of spherical particles. FIG. 10 shows the results of 2θ/θ measurement by XRD with respect to the PLT in the seed layer 4 in Practical Example 3.

FIG. 10 reveals that the seed layer 4 of PLT was strongly aligned with (111) plane of perovskite. Let the degree of alignment of (111) plane be expressed by (111)/[(100)+ (110)+(111)]×100, then calculating the degree of alignment of (111) plane of PLT using the peak intensities shown in FIG. 10 gave a degree of alignment of 95%. This means that, in the PLT in Practical Example 3, 90% or more of crystals were aligned with (111) plane of perovskite.

On the other hand, observation on a SEM revealed that PLT crystals had a particle diameter of about 40 nm, and that the seed layer 4 of PLT had a structure in which two layers each comprising crystals 4a of spherical particles were stacked together.

Next, on a sputtering machine, further on the seed layer 4 of PLT, PZT was formed with a thickness of about 4 μm to form a piezoelectric layer 5. Here, PZT was sputtered at an Ar flow rate of 30 sccm, an $O_2$ flow rate of 0.6 sccm, a pressure of 0.5 Pa, a substrate temperature of 600° C., and a target-applied RF power of 500 W. The sputtering target had a mol ratio of Zr to Ti (Zr/Ti ratio) of 52/48.

Figure 11:
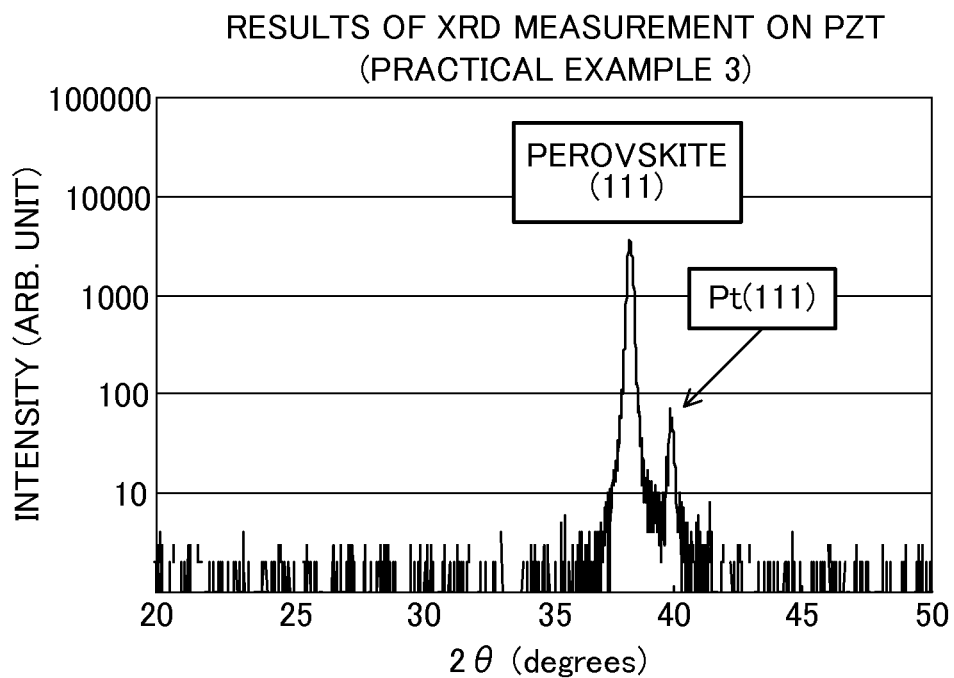
FIG. 11 is a plot of results of 2θ/θ measurement by XRD with respect to PZT forming a piezoelectric layer in a piezoelectric element according to Practical Example 3.

FIG. 11 shows the results of 2θ/θ measurement by XRD with respect to the PZT in the piezoelectric layer 5 in Practical Example 3. Calculating the degree of alignment of (111) plane of PZT by the same method (according to the same formula) as for PLT using the peak intensities shown in FIG. 11 gave a degree of alignment of 99%. That is, in the PZT in the Practical Example 3, 90% or more of crystals were aligned with (111) plane of perovskite.

Next, on the piezoelectric layer 5, an upper electrode 6 was formed, thereby completing the production of the piezoelectric element 10. Then, as with Practical Example 1, through examination by a cantilever method on a piezoelectric displacement tester, piezoelectric displacement was measured and piezoelectric constant $d_{31}$ was determined. The piezoelectric constant $d_{31}$ was −120 pm/V. Also, as with Practical Example 1, the withstand voltage of the piezoelectric element 10 was measured. The withstand voltage was, with a positive bias, +90 V and, with a negative bias, −86 V. That is, as a result of PZT being preferentially aligned with (111) plane, Practical Example 3 had a piezoelectric constant $d_{31}$ slightly lower than those in Practical Examples 1 and 2, but had withstand voltages comparable with those in Practical Examples 1 and 2.

COMPARATIVE EXAMPLE 1

In Comparative Example 1, as in Practical Example 1, first, on a substrate 1, a thermally oxidized film 2 was formed, and then, on the thermally oxidized film 2, a Ti layer (adhesion layer) with a thickness of about 20 nm and a Pt layer with a thickness of about 100 nm were formed by sputtering to form a lower electrode 3. Here, Ti was sputtered at an Ar flow rate of 20 sccm, a pressure of 0.3 Pa, a target-applied RF power of 90 W, and a substrate temperature of 550° C.; Pt was sputtered at an Ar flow rate of 20 sccm, a pressure of 0.4 Pa, a target-applied RF power of 150 W, and a substrate temperature of 550° C.

Next, on the Pt layer of the lower electrode 3, a PLT layer with a thickness of 150 nm was formed by sputtering to form a seed layer 4. Here, PLT was sputtered at an Ar flow rate of 18 sccm, an $O_2$ flow rate of 0.5 sccm, a pressure of 0.5 Pa, a target-applied RF power of 150 W, and a substrate temperature of 680° C.

Figure 12:
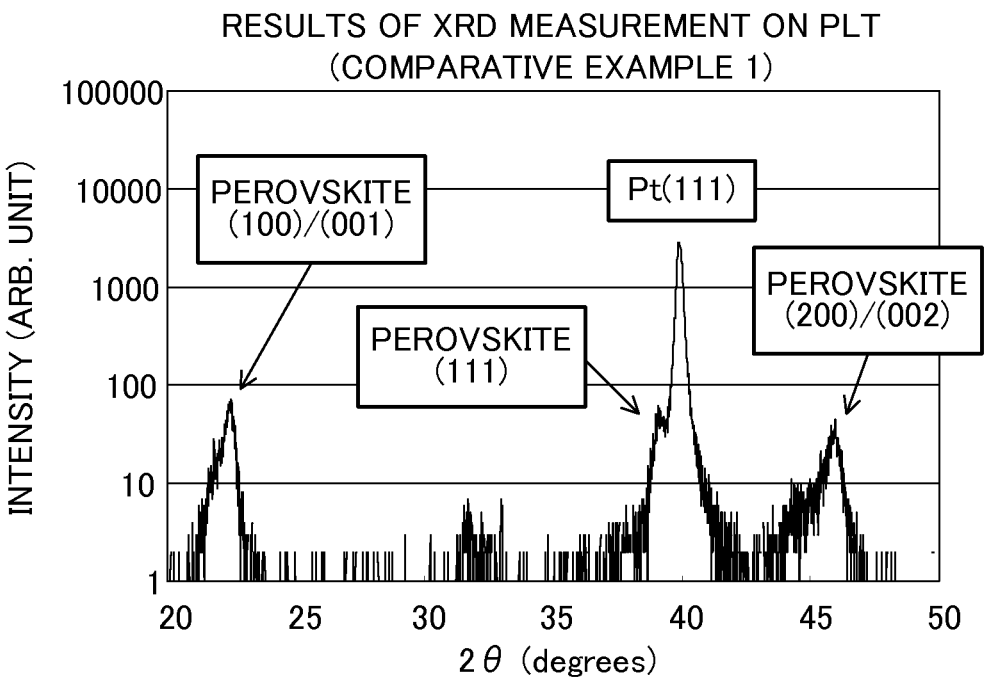
FIG. 12 is a plot of results of 2θ/θ measurement by XRD with respect to PLT forming a seed layer in a piezoelectric element according to Comparative Example 1.

Forming the Ti, Pt, and PLT layers with the thicknesses and under the film forming conditions mentioned above yielded PLT crystals of columnar particles. FIG. 12 shows the results of 2θ/θ measurement by XRD with respect to the PLT in the seed layer 4 in Comparative Example 1.

Calculating the degree of alignment of (100) plane of PLT as in Practical Example 1 using the peak intensities shown in FIG. 12 gave a degree of alignment of 64%. On the other hand, observation on a SEM revealed that PLT crystals had a particle diameter of about 80 nm, and that the seed layer 4 of PLT comprised columnar particles with crystals grown in the film thickness direction.

Next, on a sputtering machine, further on the seed layer 4 of PLT, PZT was formed with a thickness of about 4 μm to form a piezoelectric layer 5. Here, PZT was sputtered at an Ar flow rate of 30 sccm, an $O_2$ flow rate of 0.3 sccm, a pressure of 0.3 Pa, a substrate temperature of 650° C., and a target-applied RF power of 500 W. The sputtering target had a mol ratio of Zr to Ti (Zr/Ti ratio) of 52/48.

Figure 13:
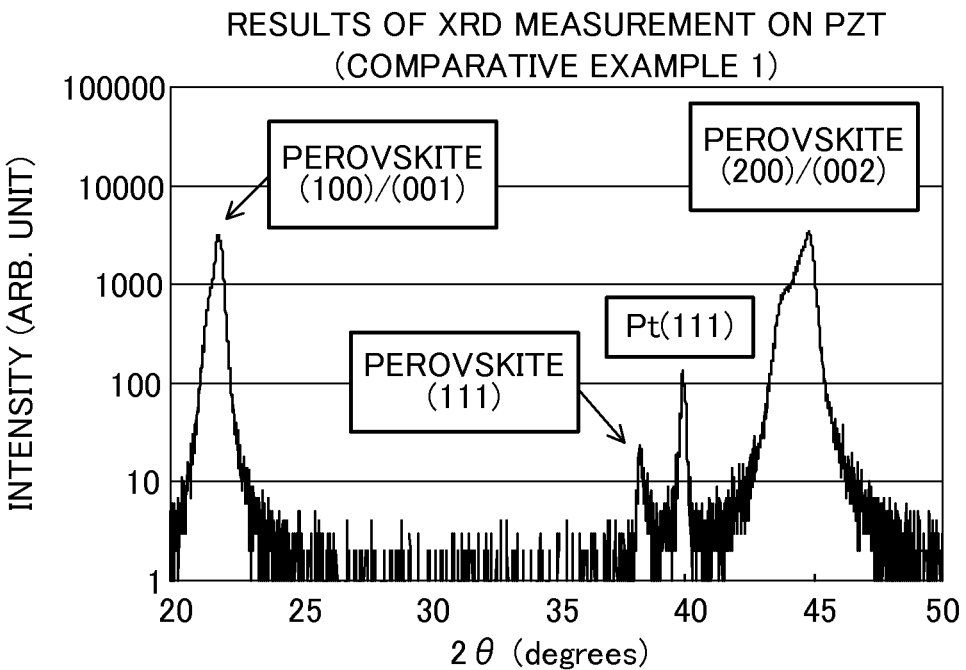
FIG. 13 is a plot of results of 2θ/θ measurement by XRD with respect to PZT forming a piezoelectric layer in a piezoelectric element according to Comparative Example 1.

FIG. 13 shows the results of 2θ/θ measurement by XRD with respect to the PZT in the piezoelectric layer 5 in Comparative Example 1. Calculating the degree of alignment of (100) plane of PZT by the same method (according to the same formula) as for PLT using the peak intensities shown in FIG. 13 gave a degree of alignment of 95%.

Next, on the piezoelectric layer 5, an upper electrode 6 was formed, thereby completing the production of the piezoelectric element 10. Then, as with Practical Example 1, through examination by a cantilever method on a piezoelectric displacement tester, piezoelectric displacement was measured and piezoelectric constant $d_{31}$ was determined. The piezoelectric constant $d_{31}$ was −156 pm/V. Also, as with Practical Example 1, the withstand voltage of the piezoelectric element 10 was measured. The withstand voltage was, with a positive bias, +56 V and, with a negative bias, −61 V. That is, Comparative Example 1 did not have a satisfactory withstand voltage as in Practical Examples 1 to 3. FIG. 7 also shows the results of withstand voltage measurement in Comparative Example 1.

The results obtained as described above with Practical Examples 1 to 3 and Comparative Example 1 reveal the following.

Forming the seed layer 4 out of two or more layers comprising crystals of spherical particles as in Practical Examples 1 to 3, compared with forming the seed layer 4 from crystals of columnar particles as in Comparative Example 1, helps greatly improve withstand voltage, and thus helps satisfactorily improve the reliability of the piezoelectric element 10. In particular, even when the piezoelectric layer 5 is formed of PZT, which is a common piezoelectric material, withstand voltage can be improved satisfactorily.

Moreover, giving the crystals forming the seed layer 4 a perovskite structure and aligning 90% or more of them with (100) or (001) plane as in Practical Examples 1 and 2 permits formation, on the seed layer 4, of a piezoelectric layer 5 that has a perovskite structure and that is preferentially aligned with (100) or (001) plane. Forming the piezoelectric layer 5 in this way, compared with forming the piezoelectric layer 5 such that its crystals are preferentially aligned with (111) plane, helps obtain a higher piezoelectric constant $d_{31}$, and thus helps obtain a larger displacement by efficiently deforming the piezoelectric layer 5 under application of a voltage.

In particular, owing to the seed layer 4 being formed of PLT (having a perovskite crystal structure), the piezoelectric layer 5 having a perovskite crystal structure can easily be formed on the seed layer 4; thus, a piezoelectric layer 5 having good piezoelectric properties can be obtained.

Although Practical Examples 1 to 3 deal with examples where the seed layer 4 is formed out of two or three layers stacked together each comprising crystals of spherical particles, the seed layer 4 can be formed out of four or more layers stacked together. Also in that case, as in Practical Examples 1 to 3, no grain boundaries (leak paths) extending straight in the film thickness direction are formed, and thus withstand voltage can be improved satisfactorily.

[Application Examples of Piezoelectric Elements]

Figure 14:
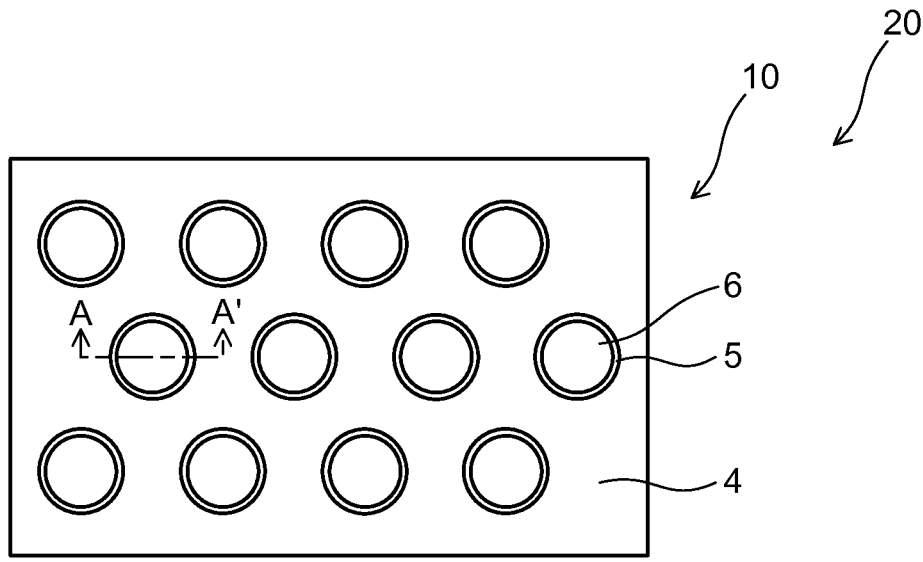
FIG. 14 is a plan view showing the structure of a piezoelectric device incorporating a piezoelectric element according to the embodiment.
Figure 15:
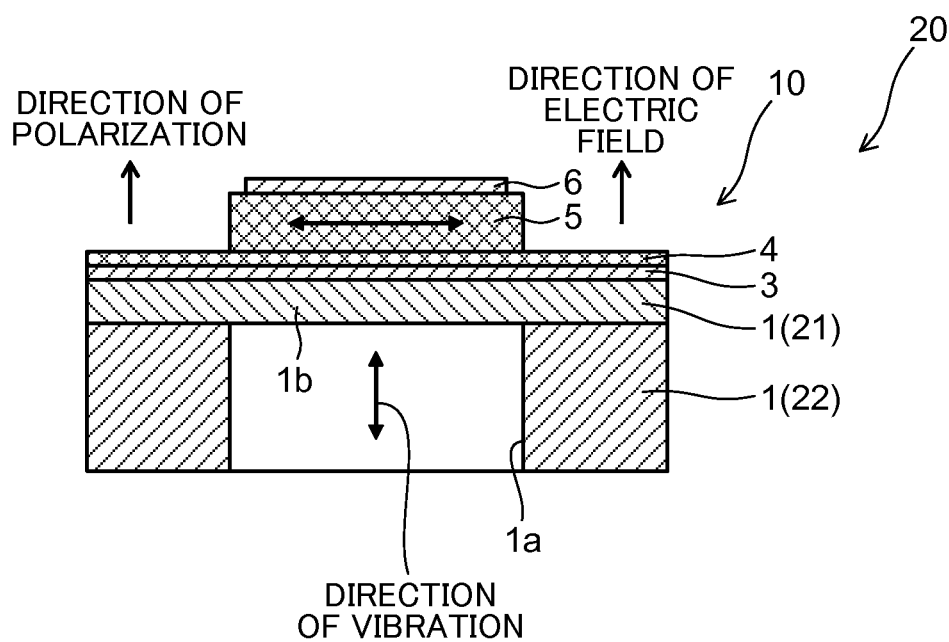
FIG. 15 is a sectional view across line A-A' in FIG. 14 as seen from the arrow-indicated direction.

FIG. 14 is a plan view showing the structure of a piezoelectric device 20 in which a piezoelectric element 10 produced as in the embodiment is applied to a diaphragm (vibrating membrane), and FIG. 15 is a sectional view across line A-A' in FIG. 14 as seen from the direction indicated by arrows. Here, the piezoelectric device 20 is assumed to be driven by exploiting $d_{31}$ deformation of the piezoelectric layer 5 (with the direction of electric field and the direction of polarization identical, deformation (expansion and contraction) occurring perpendicularly to them).

The piezoelectric device 20 is produced by forming openings in the substrate 1 of the piezoelectric element 10. More specifically, the substrate 1 is composed of two Si substrates 21 and 22 bonded together, and openings 1a having a circular cross section are formed in one Si substrate 22 (support substrate). The parts of the other Si substrate 21 located over the openings 1a (the parts constituting an upper wall to the openings 1a act as a diaphragm 1b. The substrate 1 can be formed out of a single Si substrate, in which case parts of the Si substrate are removed in the thickness direction to form openings, and the parts remaining over the openings act as a diaphragm.

The piezoelectric layer 5 is arranged in regions of the substrate 1 where it is needed, in a two-dimensionally staggered array. The lower and upper electrodes 3 and 6 are connected via unillustrated leads to a control circuit provided externally. Although the piezoelectric layer 5 is shown to be located over an opening 1a, it can be expanded further outward, beyond over the side wall of the opening 1a, to allow the upper electrode 6 to be led out. That is, the piezoelectric layer 5 has to be located at least over the opening 1a.

Applying an electrical signal from the control circuit to the lower and upper electrodes 3 and 6 sandwiching the piezoelectric layer 5 in a particular region drives that part of the particular piezoelectric layer 5 alone. That is, when a predetermined electric field is applied to the electrodes above and below the piezoelectric layer 5, the piezoelectric layer 5 expands and contracts in the lateral direction, and, by the bimetal effect, the piezoelectric layer 5 and the diaphragm 1b warp up and down. Thus, filling the opening 1a in the substrate 1 with gas or liquid permits the piezoelectric device 20 to be used as a pump, which is suitable in, e.g., ink jetheads. A piezoelectric element 10 according to the embodiment described above is thus very effective in improving withstand voltage in such use of the piezoelectric device 20.

On the other hand, detecting the amount of electric charge in the piezoelectric layer 5 in a particular region via the lower and upper electrodes 3 and 6 permits detection of the amount of deformation of the piezoelectric layer 5. That is, when an acoustic or ultrasonic wave vibrates the piezoelectric layer 5, by the effect reverse to that mentioned above, an electric field is produced between the electrodes above and below it. Thus, detecting the intensity of the electric field and the frequency of the detected signal permits the piezoelectric device 20 to be used as a sensor (ultrasonic sensor).

Moreover, the PZT forming the piezoelectric layer 5 has, in addition to piezoelectric properties, pyroelectric and ferromagnetic properties. Thus, the piezoelectric element 10 can also be used as a device such as an infrared sensor (heat sensor) or a non-volatile storage memory.

Figure 16:
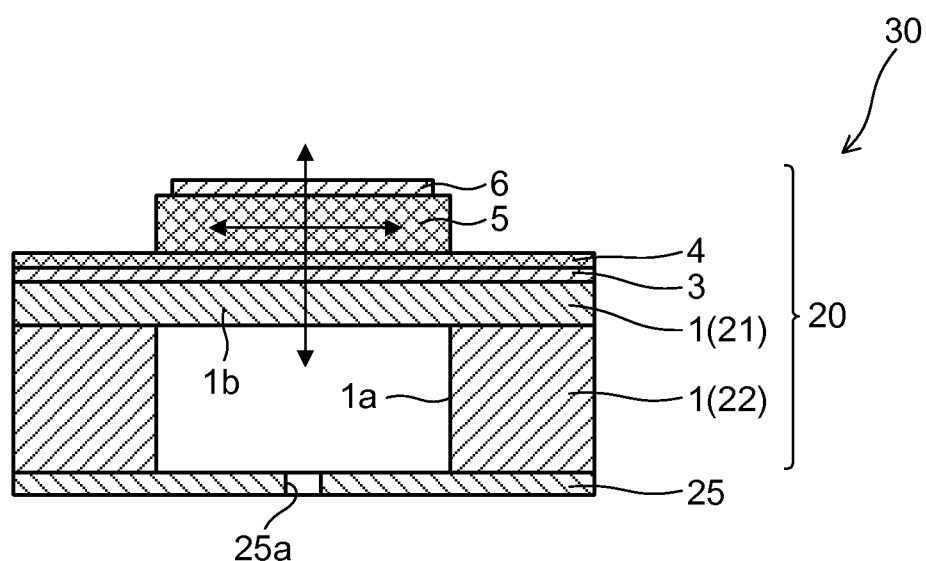
FIG. 16 is a sectional view of an ink-jet head incorporating the above piezoelectric device.

An ink jethead, mentioned above, will now be described supplementarily. FIG. 16 is a sectional view of an ink-jet head 30 incorporating a piezoelectric device 20. The ink-jet head 30 is built by bonding (e.g., by anodic bonding) a nozzle plate 25 to the substrate 1 of the piezoelectric device 20 via an unillustrated glass plate. The nozzle plate 25 has a nozzle orifice 25a, so that the opening 1a in the substrate 1 communicates with the outside via the nozzle orifice 25a. The opening 1a is coupled to an unillustrated ink supply passage, and functions as a pressurizing chamber for holding ink supplied to it through the ink supply passage. With this structure, applying a voltage to the lower and upper electrodes 3 and 6 to warp the diaphragm 1b, and pressurizing the ink inside the opening 1a, permits the ink to be discharged to the outside through the nozzle orifice 25a.

Figure 17:
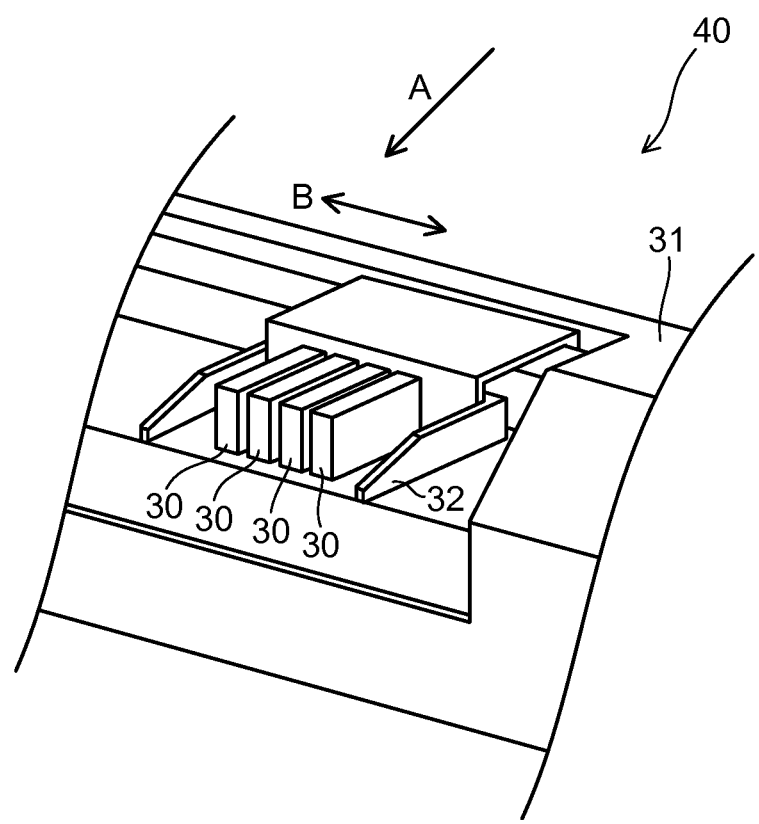
FIG. 17 is a perspective view showing, on an enlarged scale, a part of an ink-jet printer incorporating the above ink-jet head.
Figure 18:
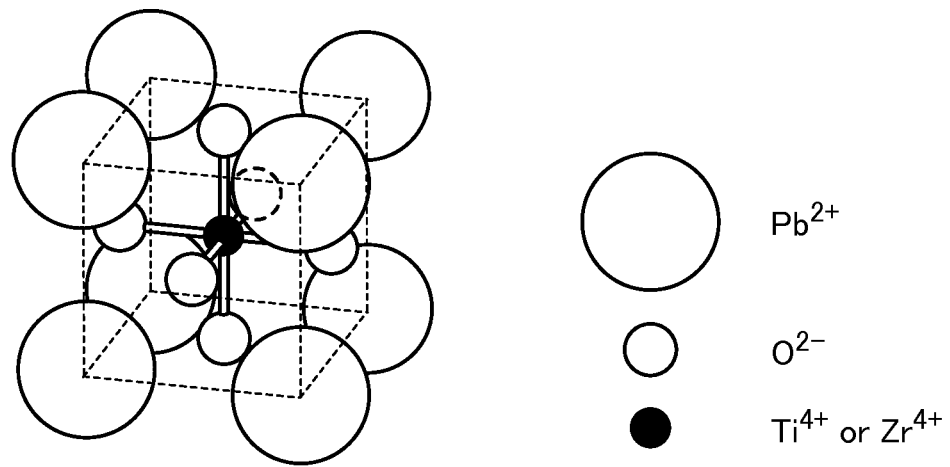
FIG. 18 is an illustrative diagram schematically showing the crystal structure of PZT.
Figure 19:
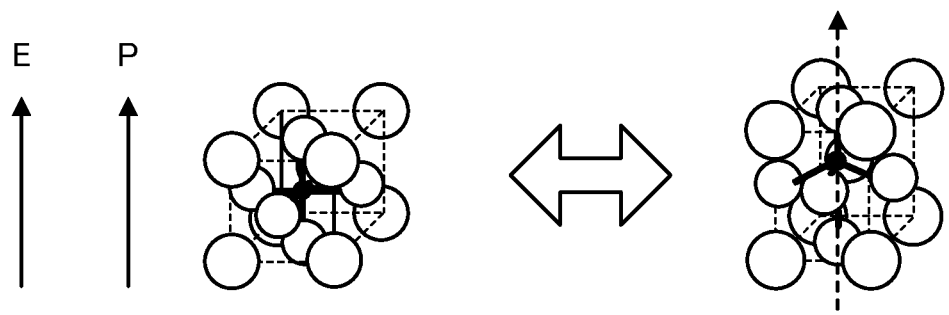
FIG. 19 is an illustrative diagram schematically showing how different crystal orientations of a piezoelectric substance exhibits the piezoelectric effect differently.
Figure 19:
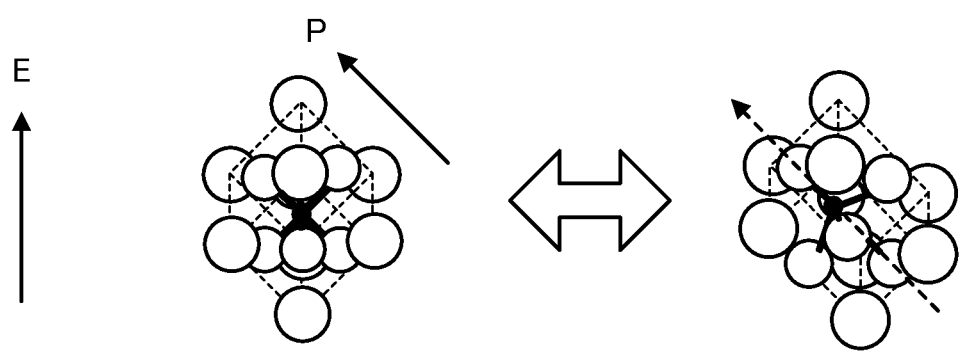
Figure 20:
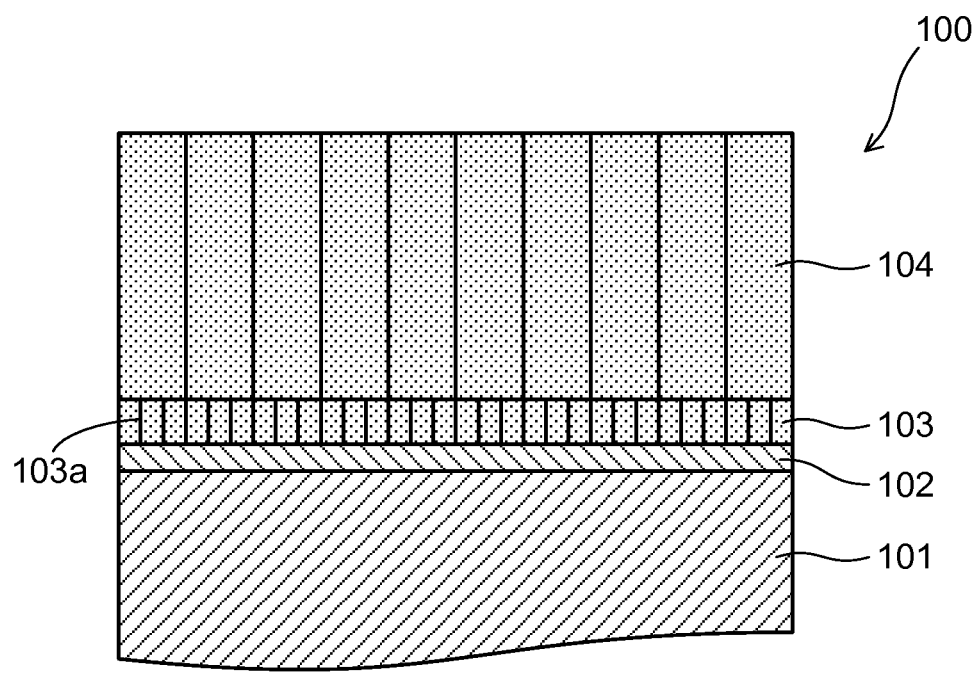
FIG. 20 is a sectional view schematically showing an outline of the structure of a conventionally common piezoelectric element having a seed layer.
Figure 21:
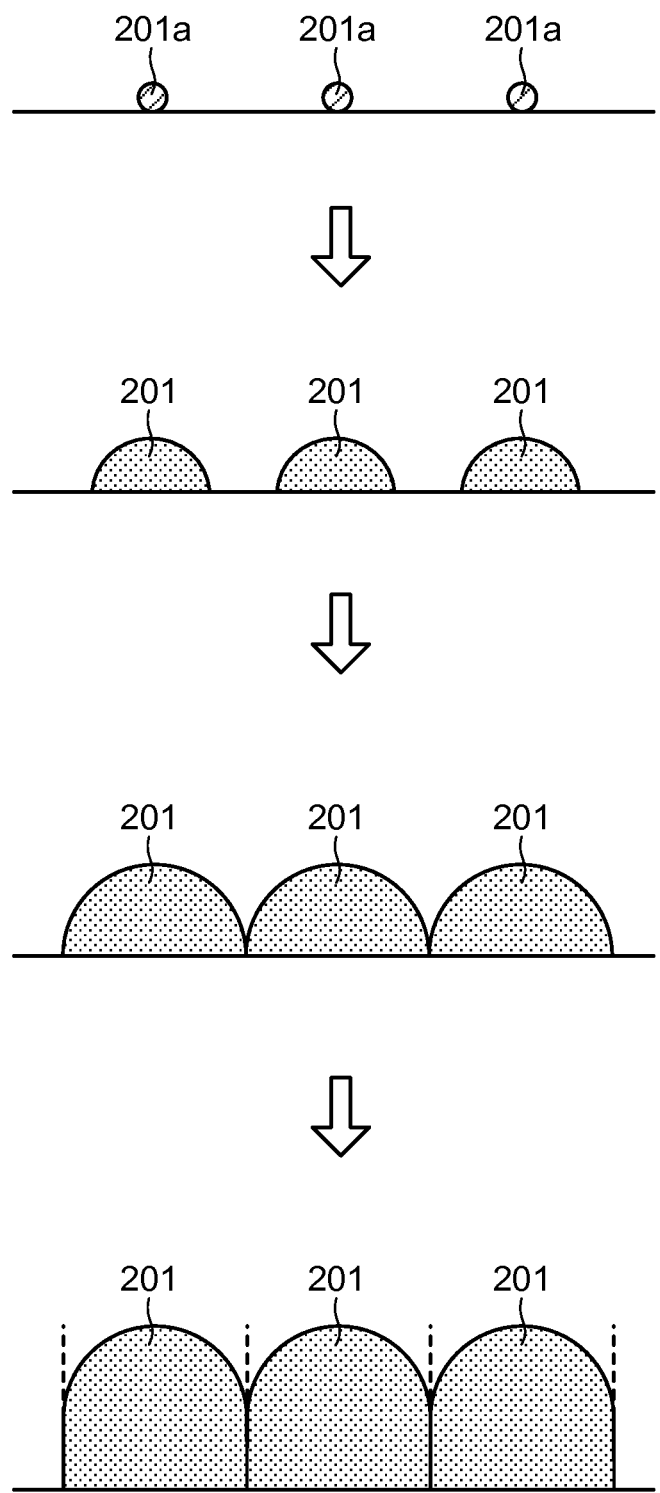
FIG. 21 is a sectional view schematically showing a typical growth process of crystals as observed when the above seed layer is formed by sputtering.

FIG. 17 is a perspective view showing, on an enlarged scale, a part of an ink-jet printer 40 incorporating the ink-jet head 30 described above. The ink-jet printer 40 has, inside its partly open housing 31, a carriage 32 which is movable in the lateral direction (direction B in FIG. 17). On the carriage 32, a row of ink-jet heads 30 for a plurality of colors (e.g., four colors, namely yellow, magenta, cyan, and black) is mounted. While an unillustrated recording medium is carried through the printer from back to front, the carriage 32 is moved laterally, and meanwhile ink of the different colors is discharged from the corresponding ink jetheads 30 to form a color image on the recording medium.

[Variations and Modifications]

The lower electrode 3 is not limited to an electrode layer of Pt as in the embodiment, but can instead be an electrode layer of any metal or metal oxide, such as Au, Ir, $IrO_2$, $RuO_2$, $LaNiO_3$, or $SrRuO_3$, or any combination of those.

The material of the seed layer 4 is not limited to PLT as in the embodiment, but can instead be any oxide, such as $LaNiO_3$, $SrRuO_3$, or $PbTiO_3$.

The material of the piezoelectric layer 5 is not limited to PZT as in the embodiment, but can instead be PZT having an impurity, such as La, Nb, or Sr, added to it, or an oxide, such as $BaTiO_3$, $LiTaO_3$, $Pb(Mg,Nb)O_3$, $Pb(Ni,Nb)O_3$, or $PbTiO_3$, or any combination of those.

The piezoelectric element described herein is one that has an electrode, a seed layer for controlling the crystal orientation of a piezoelectric layer, and the piezoelectric layer stacked in this order from the substrate side, wherein the seed layer is composed of two or more layers stacked together each comprising crystals of spherical particles.

Using spherical particles instead of columnar particles as crystal particles forming the seed layer permits, when two or more layers comprising such spherical particles are stacked together, the spherical particles in a second layer to be located shifted from right above the spherical particles in a first layer, and likewise permits, for a third and any further layers, the spherical particles in an upper layer to be located shifted from right above the spherical particles in the layer immediately beneath. Thus, the interfaces between neighboring spherical particles (grain boundaries) are connected together substantially into a web, and this helps avoid formation, under application of a voltage, of leak paths extending straight in the film thickness direction of the seed layer. Thus, even with a structure including a seed layer, withstand voltage in actual use (in application to a device) can be improved satisfactorily, and the reliability of the piezoelectric element can be improved.

Preferably, in the seed layer, the spherical particles in an upper layer are located shifted, in a direction perpendicular to the film thickness direction, from right above the spherical particles in the layer immediately beneath. This helps reliably connect the grain boundaries together into a web, and helps reliably prevent formation of leak paths extending straight in the film thickness direction of the seed layer. Thus, withstand voltage in actual use can reliably be improved.

Preferably, the crystals forming the seed layer have a perovskite structure, and 90% or more of the crystals are aligned with (100) or (001) plane.

Then, the piezoelectric layer formed over the seed layer can be formed with a perovskite structure and can be preferentially aligned with (100) or (001) plane to conform to the crystal orientation of the seed layer.

Preferably, the crystals forming the piezoelectric layer have a perovskite structure, and 90% or more of the crystals are aligned with (100) or (001) plane. Then, as compared with a structure where the crystals in the piezoelectric layer are aligned with (111) plane, the piezoelectric layer can be deformed efficiently under application of a voltage to offer improved piezoelectric properties.

The seed layer can be formed of PLT. PLT has a perovskite crystal structure and, on the seed layer of PLT, a piezoelectric layer can easily be formed with a perovskite crystal structure so as to offer good piezoelectric properties.

The piezoelectric layer can be formed of PZT or PZT having an impurity added to it. Forming the piezoelectric element out of such a material helps improve withstand voltage in actual use.

Preferably, the piezoelectric element described above has the electrode as a lower electrode, and further has an upper electrode formed on the opposite side of the piezoelectric layer from the lower electrode. Owing to the seed layer being formed as described above, withstand voltage can be improved satisfactorily; thus, a higher voltage can be applied between the upper and lower electrodes to produce a larger displacement in the piezoelectric layer.

The piezoelectric device described herein incorporates the piezoelectric element described above, wherein, preferably, an opening is formed in the substrate of the piezoelectric element, and the piezoelectric layer is located at least over the opening.

Liquid (e.g., ink) or gas can be held inside the opening; then applying a voltage to the upper and lower electrodes to deform the piezoelectric element, and applying a pressure to the liquid etc. inside the opening, permits the liquid etc. to be discharged to the outside. In this way, a piezoelectric device that functions as a pump (including an ink jethead) and that has a satisfactorily improved withstand voltage is obtained. On the other hand, detecting via the upper and lower electrodes the potential difference resulting from a displacement in the piezoelectric layer on receiving an acoustic or ultrasonic wave through the opening helps obtain a piezoelectric device that functions as an ultrasonic sensor.

In the present description, "spherical" in "spherical particles" denotes a shape that is not "columnar," i.e., that is not a shape extending in one direction while keeping the same cross-sectional shape; thus the term "spherical" covers not only a perfectly spherical shape but also any modified spherical shape, a shape with an elliptical cross section, a polyhedral shape other than columnar, any shape defined by a combination of flat and curved surfaces, a shape with bumps and dents, etc.

As described above, forming a seed layer from crystals of spherical particles, and stacking two or more such layers together permits the spherical particles to be located shifted between an upper and a lower layer, and thus helps avoid formation of leak paths extending straight in the film thickness direction of the seed layer along grain boundaries. Thus, even with a structure including a seed layer, withstand voltage in application to a device can be improved satisfactorily, and the reliability of the piezoelectric element can be improved.

INDUSTRIAL APPLICABILITY

Piezoelectric elements according to the present invention find applications in, e.g., various devices such as ink-jet heads, ultrasonic sensors, infrared sensors, and non-volatile memories, and in ink-jet printers.

LIST OF REFERENCE SIGNS 1 substrate
1a opening
3 lower electrode
4 seed layer
4a crystal
5 piezoelectric layer
6 upper electrode
10 piezoelectric element
20 piezoelectric device
30 ink-jet head
40 ink-jet printer

The invention claimed is:

1. A piezoelectric element comprising an electrode, a seed layer having a structure that controls crystal orientation of a piezoelectric layer, and the piezoelectric layer stacked in this order from a substrate side, wherein the seed layer comprises two or more layers stacked together each comprising spherical particles.

2. The piezoelectric element according to claim 1, wherein, in the seed layer spherical particles in an upper layer are located shifted, in a direction perpendicular to a film thickness direction, from right above spherical particles in a layer immediately beneath.

3. The piezoelectric element according to claim 1, wherein the spherical particles comprising the seed layer have a perovskite structure, and 90% or more of the spherical particles are aligned with (100) or (001) plane.

4. The piezoelectric element according to claim 3, wherein the piezoelectric layer comprises crystals having a perovskite structure, and 90% or more of the crystals are aligned with (100) or (001) plane.

5. The piezoelectric element according to claim 1, wherein the seed layer comprises PLT.

6. The piezoelectric element according to claim 1, wherein the piezoelectric layer comprises either PZT or PZT comprising an impurity added thereto.

7. The piezoelectric element according to claim 1, wherein the electrode is a lower electrode, and the piezoelectric element further comprises an upper electrode formed on an opposite side of the piezoelectric layer from the lower electrode.

8. A piezoelectric device comprising the piezoelectric element according to claim 1, wherein an opening is formed in the substrate of the piezoelectric element, and the piezoelectric layer is located at least over the opening.

9. An ink-jet head comprising:

a nozzle orifice through which the opening of claim 8 communicates with outside; and the piezoelectric element according to claim 8 for discharging ink inside the opening through the nozzle orifice.

10. An ink-jet printer comprising:

a housing; and the ink-jet head according to claim 9 movably attached to the housing.

11. The piezoelectric element according to claim 1, wherein each of the spherical particles of the seed layer is circular in a cross section along a stack direction in which the two or more layers of the seed layer are stacked.

12. The piezoelectric element according to claim 11, wherein the piezoelectric layer is formed of columnar crystals extending in the stack direction.

13. The piezoelectric element according to claim 1, wherein the seed layer comprises a material different from a material of the electrode.

14. The piezoelectric element according to claim 13, wherein the seed layer is formed of a material different from a material of the piezoelectric layer.

15. The piezoelectric element according to claim 1, wherein the electrode comprises Pt, the piezoelectric layer comprises either PZT or PZT comprising an impurity added thereto, and each of the spherical particles of the seed layer comprises PLT.

16. The piezoelectric element according to claim 1, wherein each of the spherical particles of the two or more layers of the seed layer has a particle diameter of 10 nm to 50 nm.

17. The piezoelectric element according to claim 1, wherein each of the spherical particles has a shape of a sphere.

* * * * *